United States Patent
Tracy et al.

(10) Patent No.: US 8,456,818 B2
(45) Date of Patent: Jun. 4, 2013

(54) WIRELESS CARD MODULE

(75) Inventors: Mark S. Tracy, Tomball, TX (US); Paul J. Doczy, Cypress, TX (US); Jonathan R. Harris, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1324 days.

(21) Appl. No.: 11/796,253

(22) Filed: Apr. 27, 2007

(65) Prior Publication Data
US 2008/0266774 A1 Oct. 30, 2008

(51) Int. Cl.
*H05K 5/00* (2006.01)
*H05K 7/00* (2006.01)
*G06F 1/16* (2006.01)

(52) U.S. Cl.
USPC ...................................... 361/679.02; 361/731

(58) Field of Classification Search
USPC .............................. 361/685, 686, 679.02, 731
See application file for complete search history.

(56) References Cited

U.S. PATENT DOCUMENTS

| | | | |
|---|---|---|---|
| 5,336,099 A | 8/1994 | Aldous et al. | |
| 5,457,601 A | 10/1995 | Georgopulos et al. | |
| 5,736,727 A | 4/1998 | Nakata et al. | |
| 5,736,782 A | 4/1998 | Schairer | |
| 5,779,496 A | 7/1998 | Bolinger et al. | |
| 5,913,174 A * | 6/1999 | Casarez et al. | 455/557 |
| 6,219,732 B1 | 4/2001 | Henrie et al. | |
| 6,220,873 B1 | 4/2001 | Samela et al. | |
| 6,292,146 B1 | 9/2001 | Melax | |
| 6,491,533 B2 | 12/2002 | Costello et al. | |
| 6,556,170 B2 * | 4/2003 | Northey | 343/700 MS |
| 6,985,354 B2 | 1/2006 | Yang et al. | |
| 7,054,976 B2 | 5/2006 | Park | |
| 7,142,161 B2 * | 11/2006 | Smith et al. | 343/702 |
| 7,171,503 B2 | 1/2007 | Lee et al. | |
| 2002/0022460 A1 * | 2/2002 | Lintern et al. | 455/97 |
| 2006/0077103 A1 * | 4/2006 | Hayes | 343/702 |
| 2006/0240869 A1 * | 10/2006 | Nghiem et al. | 455/558 |
| 2007/0285320 A1 * | 12/2007 | Hayes et al. | 343/702 |

FOREIGN PATENT DOCUMENTS

| | | |
|---|---|---|
| EP | 1202378 A1 | 5/2002 |
| KR | 10-2003-0073290 A | 9/2003 |

* cited by examiner

*Primary Examiner* — Anthony Haughton

(57) ABSTRACT

A wireless card module comprising a bezel assembly comprising at least one bezel member couplable to a wireless card, the bezel member configured to couple the wireless card to an external antenna.

19 Claims, 1 Drawing Sheet

WIRELESS CARD MODULE

BACKGROUND

Electronic devices, such as laptop or notebook computers, are becoming increasingly smaller in size. Because of the decreased sizes of such electronic devices, the amount of internal space for components, such as wireless antennas and/or wireless cards, has been reduced. With the increasing amount of technology choices available to a user (e.g., the various wireless antenna choices such as a wireless wide area network a wireless local area network television, a global position system (GPS), etc.), the available space within the electronic devices limits the options and types of technology choices that may be incorporated into the electronic device.

DETAILED DESCRIPTION OF THE DRAWINGS

Figures 1, 2, 3:
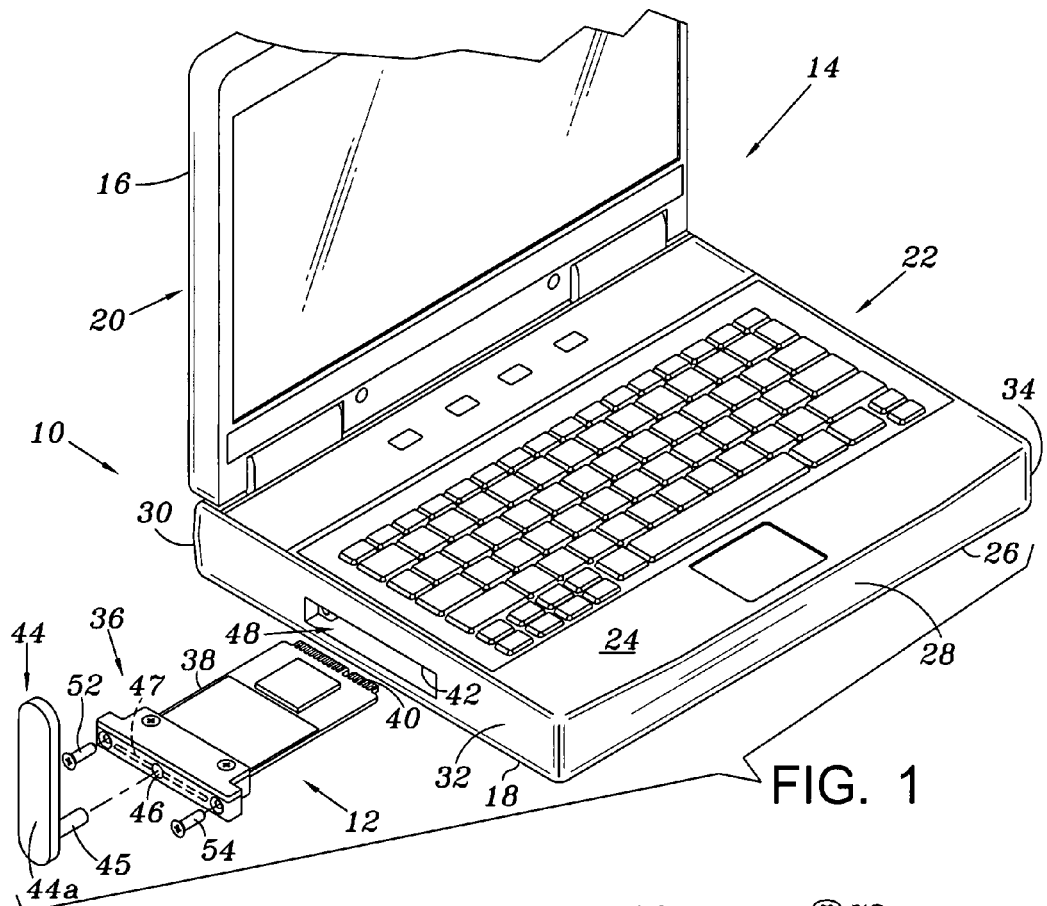
FIG. 1 is a diagram of a perspective view of a portable electronic device employing an embodiment of a wireless card module.
FIG. 2 is a diagram illustrating the wireless card module 12 of FIG. 1 disposed within the electronic device.
FIG. 3 is a diagram illustrating an exploded view of the wireless card module of FIG. 1.

Various embodiments and the advantages thereof are best understood by referring to FIGS. 1-3, like numerals being used for like and corresponding parts of the various drawings.

FIG. 1 is a diagram illustrating an electronic device 10 in which an embodiment of a wireless card module 12 is employed to advantage. In the embodiment illustrated in FIG. 1, electronic device 10 comprises a laptop or notebook computer 14; however, it should be understood that electronic device 10 may comprise any type of computing device such as, but not limited to, a tablet personal computer, a personal digital assistant, a gaming device, or any other type of portable or non-portable computing device. In the embodiment illustrated in FIG. 1, electronic device 10 comprises a display member 16 rotatably coupled to a base member 18. Display member 16 and base member 18 each comprise a housing 20 and 22, respectively, formed having a number of walls. For example, housing 22 comprises a top wall 24 forming a working surface and/or keyboard deck, a bottom wall 26, a front wall 28, a rear wall 30 and a pair of sidewalls 32 and 34.

In the embodiment illustrated in FIG. 1, wireless card module 12 comprises a bezel assembly 36 removably coupleable to a wireless communications card 38 to facilitate wireless communications by electronic device 10 with a wireless network. For example, wireless card 38 may comprise a wireless local area network (WLAN) card, a wireless wide area network (WWAN) card, or any other type of card for enabling wireless communication between electronic device 10 and a network. For example, wireless cards 38 may comprise cards such as, but not limited to, an 802.11 type card or a cellular type card for enabling wireless communication between electronic device 10 and a network. In the embodiment illustrated in FIG. 1, wireless card 38 comprises a connector 40 (e.g., an edge connector) for communicative engagement with a motherboard or other device disposed within housing 22 of electronic device 10. According to some embodiments, bezel assembly 36 enables interchangeability of wireless card 38 with different types of wireless cards 38 corresponding to a desired type of wireless communication network and/or protocol (e.g., a WLAN-type card or a WWAN-type card) without requiring modification to housing 22 or any other portion of electronic device 10. According to some embodiments, bezel assembly 36 and wireless card 38 are insertable into housing 22 of electronic device 10 through an opening 42 disposed in housing 22 and/or located on a periphery of electronic device 10 from an exterior of electronic device 10 (e.g., without disassembling electronic device 10) to facilitate insertion and removal thereof relative to housing 22.

In FIG. 1, bezel assembly 36 is communicatively coupled to wireless card 38 to facilitate wireless communications via a wireless antenna 44 communicatively couplable to bezel assembly 36. In the embodiment illustrated in FIG. 1, wireless antenna 44 is pluggable into bezel assembly 36; however, it should be understood that antenna 44 may be permanently coupled to bezel assembly 36. In the embodiment illustrated in FIG. 1, antenna 44 comprises a connector member 45 configured to be communicatively coupled to a corresponding connector member 46 on bezel assembly 36. According to some embodiments, bezel assembly 36 may also comprise an internal antenna 47 embedded in bezel assembly 36 in lieu of antenna 44 or in addition to antenna 44 to extend the range of wireless card 38.

In the embodiment illustrated in FIG. 1, housing 22 comprises an external bay 48 configured to receive bezel assembly 36 and wireless card 38. In the embodiment illustrated in FIG. 1, bezel assembly 36 (and wireless card 38) are secured within external bay 48 to housing 22 via screws 52 and 54 to prevent separation of bezel assembly 36 from housing 22. It should be understood that other methods of securing bezel assembly 36 and wireless card 38 in electronic device 10 may be used such as, for example, utilizing a push-push device and/or frictionally engaging bezel assembly 36 within housing 22. Furthermore, it should be understood that wireless card 38 can be inserted within electronic device 10 without bezel assembly 36 such that antenna 44 is coupled directly to wireless card 38. In FIG. 1, housing 22 comprises a single external bay 48 disposed on sidewall 32; however, it should be understood that additional external bays 48 may be formed in sidewall 32 or external bay(s) 48 may be located on any other wall of housing 22 (e.g., walls 24, 26, 28, 30, and/or 34) or in display member 16.

FIG. 2 is a diagram illustrating wireless card module 12 of FIG. 1 disposed within electronic device 10. In the embodiment illustrated in FIG. 1, bezel 36 and wireless card 38 are disposed within a profile or periphery of electronic device 10 such that external surface 50 of bezel assembly 36 is disposed flush (flush or substantially flush) with sidewall 32 of housing 22. In FIG. 2, antenna 44 is coupled to bezel assembly 36 to facilitate wireless communications with a wireless communications network.

FIG. 3 is a diagram illustrating an exploded view of wireless card module 12 of FIG. 1 usable with a plurality of wireless cards $38_1$ and $38_2$. In the embodiment illustrated in FIG. 3, bezel assembly 36 comprises bezel members 56 and 58 couplable to wireless card 38. In FIG. 3, bezel members 56 and 58 are coupled to opposite sides of wireless card 38. In FIG. 3, bezel member 58 comprises an external bay 60 configured to receive an end 62 of wireless card 38 therein. In FIG. 3, end 62 comprises a pair of antenna leads or connectors 64 and 66 configured to be aligned with and engage a corresponding pair of connectors 68 and 70 on bezel member 58, respectively. In FIG. 3, connectors 68 and 70 are communicatively coupled to connector 46 to facilitate wireless communications. When end 62 is disposed within recessed area 60 and connectors 64 and 66 are aligned with and are otherwise in contact with respective connectors 68 and 70, screws 72 and 74 are insertable through openings 76 and 78 of bezel member 56, openings 80 and 82 on wireless card 78, and into openings 84 and 86 on bezel member 58 formed therein for receiving for securely fastening wireless card 38 to bezel assembly 36. It should be understood that bezel assembly 36 may be otherwise configured such as, for example, configuring bezel member 56 with recessed area 60 or forming bezel assembly 36 of a single unitary member having recessed area 60 formed therein for receiving insertion of wireless card 38 therein.

Thus, embodiments of a wireless card module 12 provide a removably coupleable bezel assembly 36 to a wireless card 38 to facilitate communicative connection of wireless card 38 to electronic device 10. According to some embodiments, bezel assembly 36 enables interchangeability of wireless card 38 with different types of wireless cards 38. According to some embodiments, bezel assembly 36 and wireless card 38 are insertable into an external bay 48 of housing 22 of an electronic device 10 disposed on a periphery of electronic device 10. According to some embodiments, bezel assembly 36 is disposed within a periphery of electronic device 10 and is flush (flush or substantially flush) with sidewall 32 of electronic device 10.

What is claimed is:

1. A wireless card module, comprising:
    a first wireless communication card with a communication connector that fits in a bay of an electronic device, the first wireless communication card having first openings;
    a bezel attached to the first wireless communication card, the bezel detachable from the first wireless communication card and attachable to a second wireless communication card that is different than the first wireless communication card and that includes second openings at different locations than the first openings, the bezel having first card connectors to align with the first openings when the bezel is attached to the first wireless communication card and second card connectors to align with the second openings when the bezel is attached to the second wireless communication card; and
    a wireless antenna connected to the bezel.

2. The module of claim 1, wherein the communication connector connects to the first wireless communication card at one end and the bezel connects to the first wireless communication card at a second end that is opposite the first end.

3. The module of claim 1, wherein the first and second wireless communication cards are different types of wireless cards that use different protocols.

4. The module of claim 1, wherein the bezel comprises an antenna connector that removably plugs the antenna to the bezel.

5. The module of claim 1, wherein the bezel includes an internal antenna embedded in the bezel.

6. The module of claim 1, wherein the bezel includes two separate bezel members that couple to one another on opposite faces of the first wireless communication card.

7. The module of claim 1, wherein the bezel has an opening receiving an end portion of the first wireless communication card such that the bezel extends across a top major face and a bottom major face of the end portion and such that a majority of the first wireless communication card extends beyond the opening.

8. The module of claim 1, wherein the first card connectors comprise pins projecting from the bezel and located to extend through the first openings.

9. The module of claim 1, wherein the first card connectors comprise fasteners extending through openings in the bezel and located to extend through the first openings.

10. The module of claim 9, wherein the bezel comprises a first bezel member extending across and opposite to a first major face of the first wireless communication card and a second bezel member extending across and opposite to a second major face of the first wireless communication card, a second bezel member having openings into which the fasteners extend.

11. The module of claim 10, wherein the first bezel member and the second bezel member cooperate to form an opening receiving an end portion of the wireless communication card such that a majority of the wireless communication card extends beyond the opening.

12. A wireless card module, comprising:
    a wireless communication card including one end with a connector that engages an electronic device;
    a bezel attached to a second, opposite end of the wireless communication card, the bezel being removable from the wireless communication card to enable interchangeability of the wireless communication card with different types of wireless communication cards, the bezel having a first connector, the bezel having an opening receiving an end portion of the wireless communication card such that the bezel extends across a top major face and a bottom major face of the end portion and such that a majority of the wireless communication card extends beyond the opening; and
    a wireless antenna connected to the bezel assembly, wherein the bezel comprises two separate bezel members fastened to one another so as to extend across opposite major faces of the wireless communication card, one of the two bezel members including an internal bay forming a portion of the opening and receiving the end portion of the wireless communication card.

13. The module of claim 12, wherein the wireless communication card includes a pair of connectors that align with and engage a pair of connectors on the bezel.

14. The module of claim 12, wherein the bezel and the wireless communication card include an opening that receives a fastener to removably connect the bezel to the wireless communication card.

15. The module of claim 12, wherein the bezel is configured to receive an external antenna that removably connects to the bezel.

16. An electronic device, comprising:
    a bay accessible from an exterior of the electronic device;
    a wireless communication card having a connector at one end that inserts into the bay to connect with the electronic device the first wireless communication card having first openings;
    a bezel attached to a second opposite end of the wireless communication card, the bezel being removable from the wireless communication card to enable interchangeability of the wireless communication card with different types of wireless communication cards, the bezel further comprising second openings at a different locations than the first openings, the bezel having first card connectors to align with the first openings when the bezel is attached to the first wireless communication card and second card connectors to align with the second openings when the bezel is attached to the second wireless communication card the bezel having an opening receiving an end portion of the wireless communication card such that the bezel extends across a top major face and a bottom major face of the end portion and such that a majority of the wireless communication card extends beyond the opening; and
    a wireless antenna connected to the bezel assembly.

17. The electronic device of claim 16, further comprising a second wireless antenna, the second wireless antenna removably couplable to the bezel.

18. The electronic device of claim 16, wherein the wireless antenna is embedded within the bezel.

19. The electronic device of claim 16, wherein the bezel comprises a plurality of bezel members, the wireless communication card disposed at least partially between the plurality of bezel members and within a bay formed in one of the plurality of bezel members, the bay comprising a unitary body having a floor and three internal sidewalls.

* * * * *